United States Patent
Tunaboylu et al.

(10) Patent No.: US 7,462,800 B2
(45) Date of Patent: Dec. 9, 2008

(54) METHOD OF SHAPING LITHOGRAPHICALLY-PRODUCED PROBE ELEMENTS

(75) Inventors: Bahadir Tunaboylu, Gilbert, AZ (US); Edward L. Malantonio, Conshohocken, PA (US)

(73) Assignee: SV Probe Pte Ltd., Singapore (SG)

( * ) Notice: Subject to any disclaimer, the term of this patent is extended or adjusted under 35 U.S.C. 154(b) by 229 days.

(21) Appl. No.: 11/280,090

(22) Filed: Nov. 16, 2005

(65) Prior Publication Data

US 2006/0119376 A1 Jun. 8, 2006

Related U.S. Application Data

(60) Provisional application No. 60/633,017, filed on Dec. 3, 2004.

(51) Int. Cl.
B23K 26/38 (2006.01)
B23H 1/00 (2006.01)

(52) U.S. Cl. ............................. 219/121.69; 219/69.17

(58) Field of Classification Search ............ 219/69.17, 219/121.69, 121.72; 324/724, 761, 762
See application file for complete search history.

(56) References Cited

U.S. PATENT DOCUMENTS

| | | | | | |
|---|---|---|---|---|---|
| 4,262,891 | A | * | 4/1981 | Kinney | 269/71 |
| 4,705,438 | A | * | 11/1987 | Zimmerman et al. | 409/132 |
| 4,728,773 | A | * | 3/1988 | Roberts et al. | 219/121.67 |
| 5,916,460 | A | * | 6/1999 | Imoto et al. | 219/121.67 |
| 6,016,061 | A | * | 1/2000 | Mizuta | 324/762 |
| 6,075,221 | A | * | 6/2000 | Minhas | 219/121.69 |
| 6,414,501 | B2 | * | 7/2002 | Kim et al. | 324/761 |
| 6,426,638 | B1 | * | 7/2002 | Di Stefano | 324/762 |
| 6,520,778 | B1 | | 2/2003 | Eldridge et al. | |
| 6,616,966 | B2 | | 9/2003 | Mathieu et al. | |
| 6,677,245 | B2 | | 1/2004 | Zhou et al. | |
| 6,806,723 | B2 | * | 10/2004 | Maruyama et al. | 324/761 |
| 7,151,385 | B2 | * | 12/2006 | Hirata et al. | 324/754 |

(Continued)

FOREIGN PATENT DOCUMENTS

EP 1 365 250 A1 11/2003

(Continued)

OTHER PUBLICATIONS

Takahata et al., "A Novel Micro-Electrod-Discharge Machining Method Using Electrodes Fabricated by the LIGA Process", Micro Electro Mechanical Systems, 1999, MEMS '99 Twelfth IEEE International Conference in Orlando, Fl, USa, pp. 238-243, Jan. 17-21, 1999.*

(Continued)

*Primary Examiner*—Geoffrey S Evans
(74) *Attorney, Agent, or Firm*—Hickman Palermo Truong & Becker LLP

(57) ABSTRACT

A method is provided for shaping tips of lithographically-produced probe elements configured for use in a probe card to establish electrical communication with a contact of a semiconductor device to be tested. The method includes (a) lithographically producing a plurality of probe elements and (b) using a subtractive process, such as laser ablation or micro-electro-discharge machining, to remove material from each tip of the plurality of probe elements to form each tip into a shape well adapted to penetrate a contaminant oxide layer.

9 Claims, 5 Drawing Sheets

U.S. PATENT DOCUMENTS

| | | | |
|---|---|---|---|
| 7,273,812 B2* | 9/2007 | Kim et al. | ............... 438/670 |
| 2001/0021483 A1 | 9/2001 | Mathieu et al. | |
| 2002/0148814 A1* | 10/2002 | Ishiwata et al. | ......... 219/69.17 |
| 2004/0022042 A1 | 2/2004 | Mok et al. | |
| 2004/0169521 A1* | 9/2004 | Rincon et al. | ............ 324/754 |

FOREIGN PATENT DOCUMENTS

| | | |
|---|---|---|
| EP | 1365250 A | 11/2003 |
| JP | 9-300138 A * | 11/1997 |

OTHER PUBLICATIONS

J. Yorita et al., Non-Damage Probing and Analysis of ILD Damage at Scrub Marks, Sumitomo Electric Industries, LTD. 2004 Southwest Test Workshop, Jun. 7, 2004, pp. 1-27.

International Searching Authority, "Notification of Transmittal of the International Search and the Written Opinion of the International Searching Authority, or the Declaration," PCT/US2005/042134, 11 pages.

International Searching Authority, "Written Opinion of The International Searching Authority", international application No. PCT/US2005/042134, dated Jun. 14, 2007, 7 pages.

Claims, international application No. PCT/US2005/042134, 4 pages.

European Patent Office, "Communication pursuant to Article 96(2) EPC", European application No. PCT/US2005/042134, received Nov. 5, 2007, 6 pages.

Claims, European application No. PCT/US2005/042134, 3 pages.

* cited by examiner

METHOD OF SHAPING LITHOGRAPHICALLY-PRODUCED PROBE ELEMENTS

CROSS-REFERENCE TO RELATED APPLICATIONS

This application claims the benefit of U.S. Provisional Application No. 60/633,017, filed Dec. 3, 2004, the contents of which are incorporated herein by reference.

BACKGROUND OF THE INVENTION

The present invention relates to equipment for testing of integrated circuits. More particularly, the present invention relates to a method for shaping lithographically-produced probe elements incorporated into probe cards used in testing of semiconductor integrated circuits.

In semiconductor integrated circuit manufacturing, it is conventional to test the integrated circuits ("IC's") during manufacturing and prior to shipment to ensure proper operation. Wafer testing is a well-known testing technique commonly used in production testing of wafer-mounted semiconductor IC's, wherein a temporary electrical current is established between automatic test equipment (ATE) and each IC mounted on the wafer to demonstrate proper performance of the IC's. Exemplary components used in wafer testing include an ATE test board, which is a multilayer printed circuit board that is connected to the ATE, and that transfers the test signals back and forth between the ATE and a probe card. An exemplary probe card is a printed circuit board that generally contains several hundred probe needles (or "flexible probes") positioned to establish electrical contact with a series of connection terminals (or "die contacts") on the IC wafer.

Known probe cards are available from Kulicke and Soffa Industries, Inc. of Willow Grove, Pa. Certain probe cards comprise a printed circuit board, a probe head having a plurality of flexible probes, and a space transformer which electrically connects the probes to the printed circuit board. The space transformer may comprise a multi-layer ceramic substrate, or alternatively a multi-layer organic substrate.

It is known to produce the plurality of flexible probes using lithographic techniques. For example, U.S. Pat. No. 6,616,966 (Mathier et al.) and U.S. Pat. No. 6,677,245 (Zhou et al.) each disclose lithographic methods of producing flexible probes.

One difficulty in the use of probe cards is that the surfaces of the integrated circuit die contacts or pads which are contacted by the flexible probes are typically formed from metals such as aluminum or copper which tend to oxidize, forming an electrically insulating oxide layer. Such an oxide layer is desirably breached by the flexible probe to establish proper electrical communication between each die contact and each flexible probe. It is thus desirable that the tip of each flexible probe be contoured in such a manner as to promote the ability of the flexible probes to penetrate the oxide layer. However, using conventional lithographic techniques, it is difficult to provide the flexible probe tip with the desired sharp edges best adapted to penetrate the die contact oxide layer.

It would therefore be desirable to provide a method by which the tips of lithographically produced probe elements could be shaped to enhance the ability of the probe element to establish electrical communication with a die contact.

BRIEF SUMMARY OF THE INVENTION

According to an exemplary embodiment of the present invention, a method of processing probe elements configured for use in a probe card is provided. The method includes lithographically producing a plurality of probe elements, each of the probe elements having a tip portion. The method also includes removing material from the tip portion of the plurality of probe elements to form each tip portion into a shape well adapted to penetrate a contaminant layer of a surface to be probed by the probe element.

According to another exemplary embodiment of the present invention, a method of processing probe elements configured for use in a probe card is provided. The method includes producing a plurality of probe elements, each of the probe elements having a tip portion. The method also includes removing material from the tip portion of the plurality of probe elements to form each tip portion into a shape well adapted to penetrate a contaminant layer of a surface to be probed by the probe element. The removing step includes laser ablation of the material from the tip portion.

According to yet another exemplary embodiment of the present invention, a method of processing probe elements configured for use in a probe card is provided. The method includes lithographically producing a plurality of probe elements, each of the probe elements having a tip portion. The method also includes removing material from the tip portion of the plurality of probe elements to form each tip portion into a shape well adapted to penetrate a contaminant layer of a surface to be probed by the probe element. The removing step includes laser ablation of the material from the tip portion.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, there is illustrated in the drawing a form of the invention which is presently preferred; it being understood, however, that this invention is not limited to the precise arrangements and instrumentalities shown. In the drawings.

DETAILED DESCRIPTION OF THE DRAWINGS

According to an exemplary embodiment thereof, the present invention is directed to a method of shaping tips of lithographically-produced probe elements used in a probe card to establish electrical communication with a die contact having an outer oxide layer. The method comprises a step of lithographically producing a plurality of probe elements and a step of using a subtractive process to remove material from each tip of the plurality of probe elements to form each tip into a shape well adapted to penetrate the oxide layer. For example, the subtractive process may be laser ablation. Further, the method may comprise a step of chemically polishing each probe element tip.

For example, the plurality of probe elements may be lithographically-produced in sheets such that the probe elements are connected by tie bars or the like, where the tie bars are also produced during the lithographic process. After processing of the probe elements according to the present invention (e.g., shaping the tip portion of the probe element), the probe may be singulated from the sheet (e.g., by cutting a tie bar or the like holding the probe element to the sheet) and then the singulated probe element may be bonded (e.g., wedge bonded) to a contact location of a substrate (e.g., a space transformer such as an MLO or MLC space transformer, a PCB, etc), where the substrate is configured to be part of a probe card.

Figure 1:
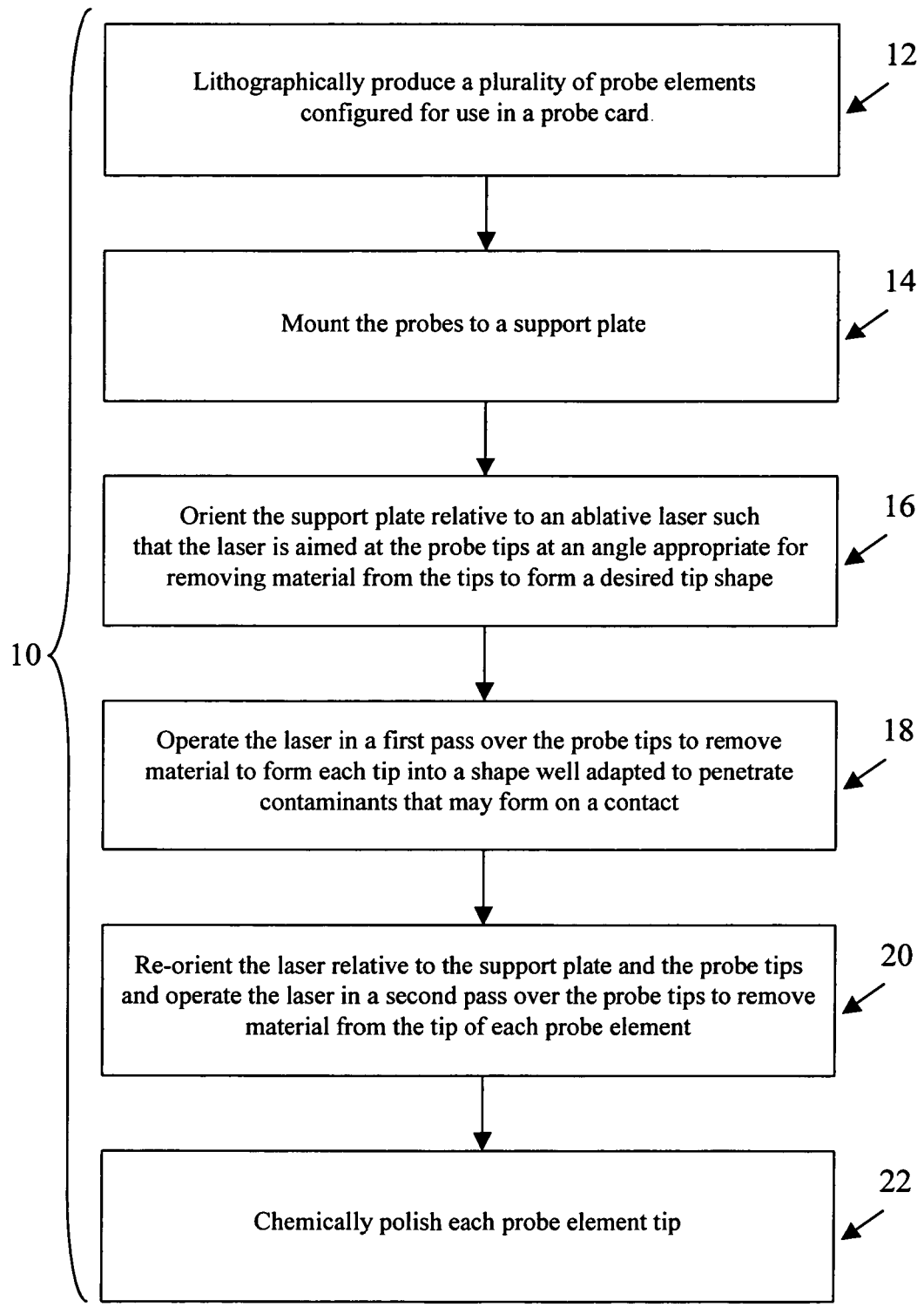
FIG. 1 is a block diagram illustrating a method of providing a probe element in accordance with an exemplary embodiment of the present invention.

Referring to the drawings a method 10 of shaping tips of lithographically-produced probe elements 30 used in connection with a probe card to establish electrical communication with a contact of a semiconductor device (e.g., in wafer form, not shown), which contact may have a contaminant layer (e.g., an outer oxide layer, not shown). With particular reference to FIG. 1, the method 10 comprises a step 12 of lithographically (e.g., using photolithography, stereolithography, etc.) producing a plurality of probe elements 30. Step 12 is conventional and known in the art of semiconductor manufacturing. A typical lithographic process generally involves laminating the desired material, masking the laminated material to define the fine product shape, UV imaging of the masked material, removing the mask and then developing the imaged material. Other lithographic processes are contemplated to produce the probe elements.

Figure 2A:
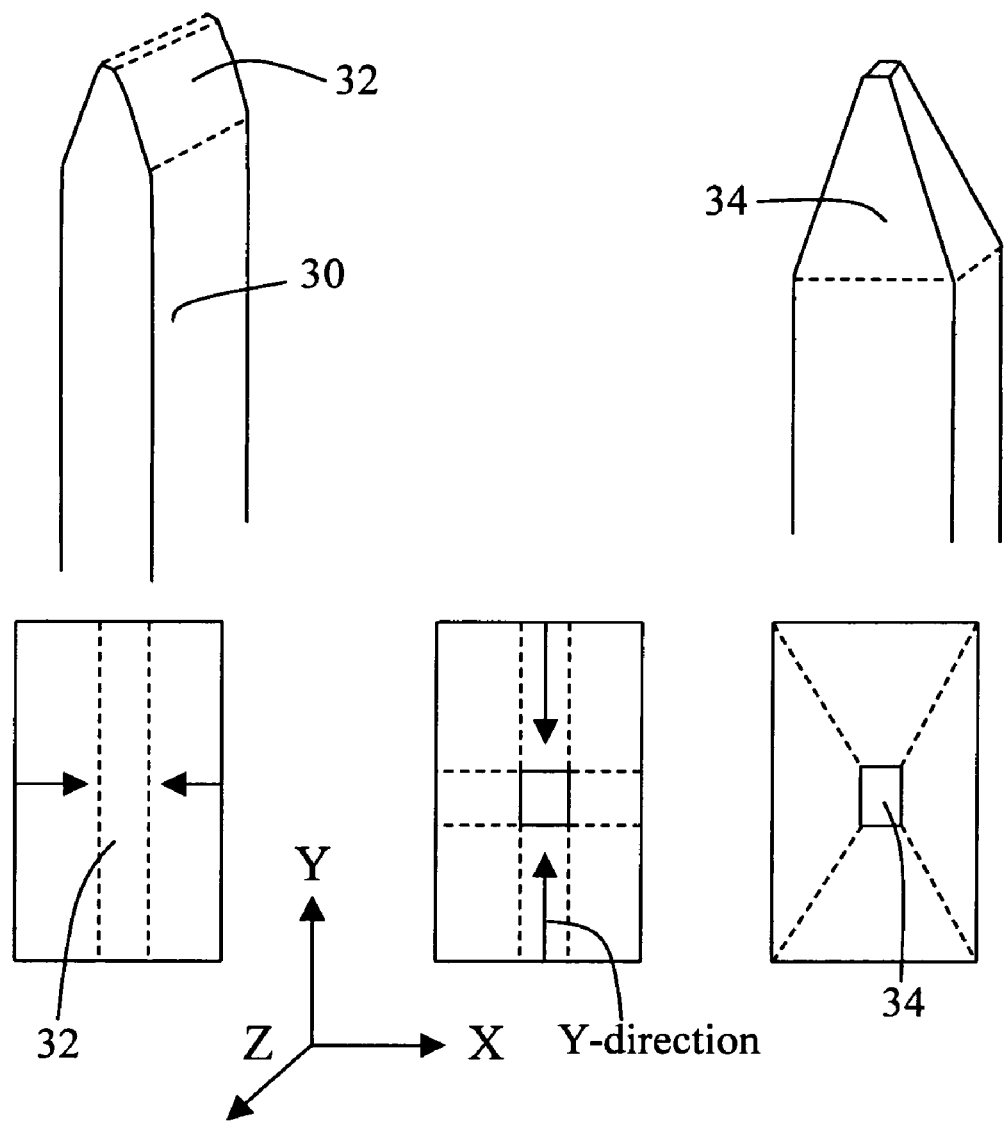
FIG. 2A illustrates an exemplary probe tip shape processed according to the exemplary method illustrated in FIG. 1.

With reference to FIG. 2A, probe elements 30 each have tip 32. For example, tips 32 are produced/shaped in a first direction by lithographic process 12. As is illustrated in the left hand portion of FIG. 2A, tip 32 is formed lithographically such that a ridge exists in tip 32, where the ridge is defined by less material in the X-direction adjacent tip 32. Additional material is removed (e.g., as shown in the illustrated Y-direction arrows in FIG. 2A) from probe tips 32 by a subtractive process such as laser ablation to form shaped probe tips 34 (see the right hand side of FIG. 2A) into a shape well-adapted to penetrate a contaminant layer such as an oxide layer (not shown).

Figure 2B:
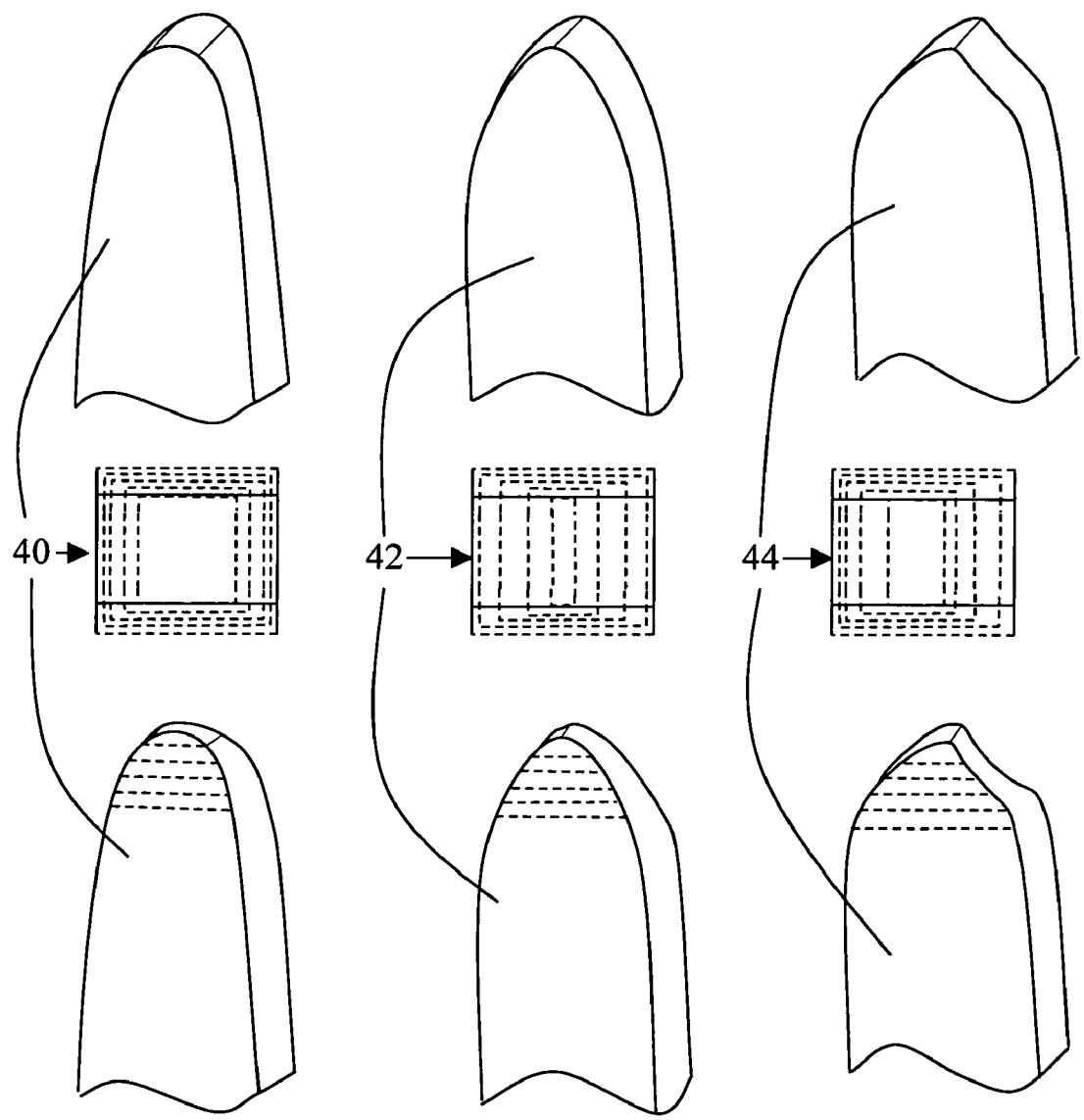
FIG. 2B illustrates certain exemplary probe tip shapes capable of being produced by the method illustrated in FIG. 1.

For example, shaped probe tip 34 may have shapes other than the pyramid shape illustrated in FIG. 2A. FIG. 2B provides side perspective and top views of probe tips having other exemplary shapes such as trapezoid shape 40, parabolic shape 42, and contoured shape 44.

The complete process may create a series of specific shapes that further define the size of the contacting tip surface. In operation of probes 30, the amount of scrub that tip 34 applies to a die contact surface (or other contact surface of the device to be tested) is dependent on various parameters, including, for example, the die contact material, the size and shape of tip 34, the overdrive distance and the spring properties of probe 30. The orientation of shaped tip 34 is designed to work in concert with the designed probe scrub force as the probe and die surfaces contact, optimally pushing contaminants (e.g., an oxide layer) away from the die contact surface with minimal debris for lowest resistance and longest life.

Figure 3A:
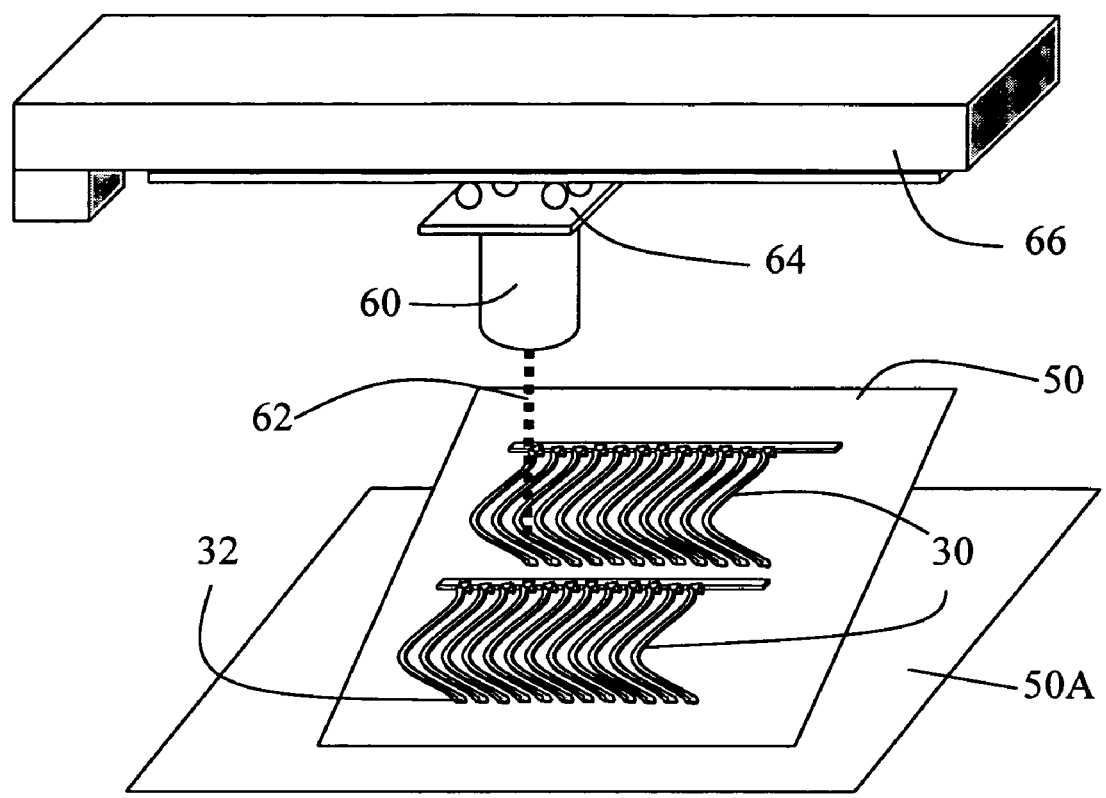
FIG. 3A illustrates an exemplary material removal system in which a laser is used to remove material from lithographically-produced probe tips.

With reference to both FIGS. 1 and 3A, method 10 further comprises step 14 of mounting probe elements 30 to support plate 50. Support plate 50 may be movable relative to ablative laser 60. Support plate 50 is oriented relative to laser 60 such that beam 62 of the laser is aimed at probe tips 32 at an angle appropriate for removing material from tips 32 to form the desired tip shape (step 16). Support plate 50 carrying probes 30 may be tilted at an angle with respect to laser 60 to obtain the desired final tip shape. As shown in FIG. 3A, support plate 50 is also positioned at an angle with respect to surface 50A, which supports plate 50. It is contemplated that surface 50A could be configured at an angle with respect to laser 60 (e.g., surface 50A may be an surface of an angled work table or the like), such that a moveable (i.e., moveable to provide an angle) support plate 50 is not utilized.

Position, energy level, and rate of movement of laser 60 (e.g., along gantry 66 using carriage 64) relative to plurality of probe tips 32 are calibrated to precisely determine that the appropriate amount of material will be removed from each probe tip 32. For example, laser 60 is scanned in a first pass over probe tips 32 to remove material from each probe tip 32 (step 18). In certain exemplary embodiments of the present invention, laser 60 is then re-oriented relative to probe tips 32, and scanned in a second pass to remove additional material to form a desired tip shape (step 20). For example, probes 30 may be inverted so that an opposing side of each tip 32 can be shaped.

For example, the subtractive process is performed using an ablative laser. An exemplary type of laser for this process is a diode pumped Nd:YAG laser. However, excimer, $CO_2$ or other types of lasers could be used. Alternatively, other methods could also be applied, such as micro-electrode-discharge machining (μEDM). Regarding the μEDM process, see "Non-Damage Probing and Analysis of ILD Damage at Scrub Marks", I. Yorita, et al., Sumitomo Electric Industries, 2004 Southwest Test Workshop Proceedings, Jun. 7, 2004.

The probe tips may be chemically polished (step 22). The probe material determines the desired chemical polishing solution to be used. For certain BeCu probes, a solution of 0.5% nitric acid, 45.5% phosphoric acid and 50% acetic acid has provided excellent results. The probes are immersed in the solution at room temperature, or slightly elevated (35° C.) for 1 to 5 minutes and then gently rinsed with deionized water. For certain nickel alloys, a polishing solution of dilute (10:1) nitric or sulfuric acid at 40° C. has provided excellent results. An exemplary technique is to immerse a shaped sheet of parts in the etchant for a short time (e.g., 1 to 2 minutes) and subsequently rinse with de-ionized water. Should the slag on the edges remain, the acid concentration and/or time of the etching may be increased. This step may be combined with surface preparation steps of a subsequent plating process.

Figure 3B:
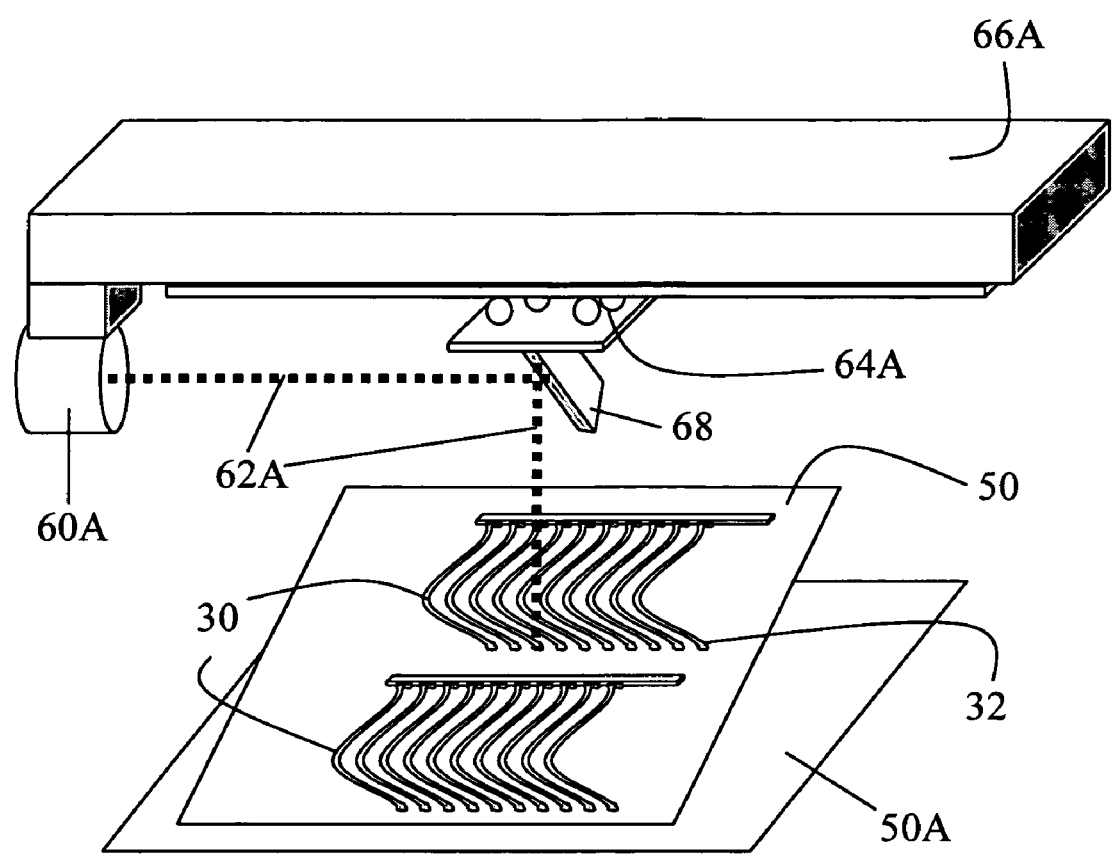
FIG. 3B illustrates another exemplary material removal system in which a laser is used to remove material from lithographically-produced probe tips.

In FIG. 3A, laser 60 moves along gantry 66 via carriage 64. In contrast, in the alternative configuration illustrated in FIG. 3B, laser 60A is fixedly positioned with respect to gantry 66A. Mirror 68 is configured to move along gantry 66A via carriage 64A, such that beam 62A (emitted from laser 60A) reflects from mirror 68 to probe tip 32. FIG. 3B is one alternative configuration to FIG. 3A, but of course, other configurations are contemplated within the scope of the invention.

While FIG. 1 has certain steps provided in a specific order, the present invention is not limited thereto. For example, certain of the steps may be eliminated, or replaced by alternative steps. Likewise, the order of the steps may be rearranged in certain configurations of the present invention.

Although FIGS. 3A-3B illustrate probe elements 30 having a specific shape (e.g., curved probe elements), the present invention is not limited thereto. The present invention relates to any type of lithographically produced (e.g., using a photolithographic process, a stereolithographic process, etc.) probe element.

Although the present invention has been described with respect to certain shaping techniques (e.g., laser ablation, micro-electrode-discharge machining, etc.), it is not limited thereto. Other techniques are contemplated.k While FIGS. 3A-3B illustrate exemplary support structures for positioning groups of probe elements 30 (connected by tie bars or the like formed during the lithographic process) during the subtractive process, the present invention is not limited thereto. For example, the present invention is not limited to using a support plate that may be oriented at an angle as with support plate 50 illustrated in FIGS. 3A-3B. The illustrated structure is exemplary in nature.

In certain exemplary embodiments of the present invention, the probe elements may be formed by techniques other than lithographic processes, for example, by stamping, etching, plating, etc.

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

What is claimed is:

1. A method of processing probe elements configured for use in a probe card, the method comprising the steps of:
    lithographically producing a plurality of probe elements, each of the probe elements having a tip portion;
    mounting the plurality of probe elemrnts to a support plate;
        orienting the support plate at a particular angle with respect to a structure used to remove material to form a particular shape to the tip portion of the probe elements that is well adapted to penetrate a contaminant layer of a surface to be probed by the probe elements;
    operating the structure in a first pass over the probe elements to form the particular shape to the tip portion of the probe elements;
    orienting the support plate and the probe elements for a second pass with respect to the structure in order to form the particular shape to the tip portion of the probe elements; and
    operating the structure in a second pass over the probe elements to form the particular shape to the tip portion of the probe elements.

2. The method of claim 1 wherein the structure is a laser ablation device.

3. The method of claim 1 wherein the structure is a micro-electro-discharge machining device.

4. The method of claim 1 further comprising polishing the tip portion of each probe element.

5. The method of claim 4 wherein the polishing step includes chemically polishing the tip portion of the probe element.

6. The method of claim 1 wherein the paticular shape of the tip portion includes at least one of a trapezoid shape, a parabolic shape, a contoured shape, or a pyramid shape.

7. The method of claim 2 further comprising polishing the tip portion of each probe element.

8. The method of claim 7 wherein the polishing step includes chemically polishing the tip portion of the probe element.

9. The method of claim 2 wherein the paticular shape of the tip portion includes at least one of a trapezoid shape, a parabolic shape, a contoured shape, or a pyramid shape.

* * * * *

UNITED STATES PATENT AND TRADEMARK OFFICE
CERTIFICATE OF CORRECTION

PATENT NO.        : 7,462,800 B2
APPLICATION NO.   : 11/280090
DATED             : December 9, 2008
INVENTOR(S)       : Bahadir Tunaboylu et al.

Page 1 of 1

It is certified that error appears in the above-identified patent and that said Letters Patent is hereby corrected as shown below:

Title Page, page 1, In Item (75) Inventors:

"Bahadir Tunaboylu, Gilbert, AZ (US);" should be -- Bahadir Tunaboylu, Chandler, AZ (US); -- Edward L. Malantonio, Conshohocken, PA (US)

Signed and Sealed this

Fourth Day of August, 2009

JOHN DOLL
*Acting Director of the United States Patent and Trademark Office*